United States Patent
Burm et al.

(10) Patent No.: US 8,482,448 B2
(45) Date of Patent: Jul. 9, 2013

(54) RAMP SIGNAL GENERATOR, ANALOG TO DIGITAL CONVERTER, AND IMAGE SENSOR

(75) Inventors: Jinwook Burm, Goyang-si (KR); Bongsub Song, Seoul (KR); Na-Yeon Cho, Goyang-si (KR); Sang-Wook Han, Busan-si (KR); Won-Hee Choe, Seoul (KR)

(73) Assignees: Samsung Electronics Co., Ltd., Suwon-si (KR); Industry-University Cooperation Foundation Sogang University, Seoul (KR)

( * ) Notice: Subject to any disclaimer, the term of this patent is extended or adjusted under 35 U.S.C. 154(b) by 43 days.

(21) Appl. No.: 13/165,495

(22) Filed: Jun. 21, 2011

(65) Prior Publication Data
US 2012/0161998 A1   Jun. 28, 2012

(30) Foreign Application Priority Data
Dec. 23, 2010  (KR) .................. 10-2010-0133855

(51) Int. Cl.
*H03M 1/56* (2006.01)
(52) U.S. Cl.
USPC .......................................... 341/169; 341/166

(58) Field of Classification Search
USPC ...................... 341/166, 169; 348/241, 243
See application file for complete search history.

(56) References Cited

U.S. PATENT DOCUMENTS

| | | | | |
|---|---|---|---|---|
| 5,982,318 | A * | 11/1999 | Yiannoulos | 341/155 |
| 7,710,306 | B2 | 5/2010 | Mori | |
| 7,864,229 | B2 | 1/2011 | Lee et al. | |
| 8,072,512 | B2 * | 12/2011 | Lee et al. | 348/241 |
| 8,098,148 | B2 * | 1/2012 | Park et al. | 340/500 |
| 2007/0132868 | A1 | 6/2007 | Lee et al. | |
| 2009/0033759 | A1 | 2/2009 | Wakabayashi | |
| 2010/0271247 | A1 | 10/2010 | Lee et al. | |
| 2012/0194367 | A1 * | 8/2012 | Wang | 341/120 |

FOREIGN PATENT DOCUMENTS

| | | |
|---|---|---|
| JP | 2009-038772 | 2/2009 |
| KR | 10-2007-0060437 | 6/2007 |
| KR | 10-2009-0099417 | 9/2009 |

* cited by examiner

*Primary Examiner* — Brian Young
(74) *Attorney, Agent, or Firm* — NSIP Law

(57) ABSTRACT

Provided is an analog-to-digital (A/D) converter that may be used in an image sensor and a ramp signal generator that is used in an A/D converter. The ramp signal generator may generate a ramp signal and a reference voltage signal that include noise that has same noise characteristics that are input into the ramp signal, such that the signal to noise ratio (SNR) is improved and the image quality is also improved.

19 Claims, 5 Drawing Sheets

RAMP SIGNAL GENERATOR, ANALOG TO DIGITAL CONVERTER, AND IMAGE SENSOR

CROSS-REFERENCE TO RELATED APPLICATION(S)

This application claims the benefit under 35 U.S.C. §119 (a) of Korean Patent Application No. 10-2010-0133855, filed on Dec. 23, 2010, in the Korean Intellectual Property Office, the entire disclosure of which is incorporated herein by reference for all purposes.

BACKGROUND

1. Field

The following description relates to an analog-to-digital (A/D) converter that may be used in an image sensor and a ramp signal generator that may be used in an A/D converter.

2. Description of the Related Art

A small sized high performance image sensor is widely used in various technical fields especially in the fields of image processing. Such an image sensor may be installed on digital cameras, camcorders, web cameras, security cameras, and the like, as well as mobile communication terminals.

The image sensor may convert an analog image received through a lens into digital signals. To perform the conversion, an analog-to-digital (A/D) converter is used. The A/D converter may use a reference signal to convert analog data into digital data, and the reference signal may vary based on the type of A/D converter. The reference signal may be easily affected by the electric power or circuit layout. Accordingly, errors may occur in the reference signal if electric power noise and circuit layout noise are input into the reference signal. These errors may cause the converted digital data to have errors thus degrading the image quality of a sensed image.

SUMMARY

In one general aspect, there is provided a ramp signal generator including an integrator configured to generate a ramp signal, and configured to generate a reference voltage signal including noise that has the same noise characteristics as noise characteristics that are input into the ramp signal.

The integrator may comprise a first component configured to generate the ramp signal by processing a signal of a direct current source, and a second component configured to generate the reference voltage signal by processing a signal of a direct voltage source, wherein the first component has the same noise characteristics as noise characteristics of the second component.

The first component and the second component may each be implemented using an amplifier.

The ramp signal generator may further comprise a gain controller configured to attenuate a magnitude of the generated ramp signal or the generated reference voltage signal using electrical resistance.

The gain controller may attenuate the magnitude of the ramp signal by connecting a plurality of resistors between an output port of the ramp signal and an output port of the reference voltage signal in series, and varying an output route such that the ramp signal is output from one node of the resistors.

The ramp signal generator may further comprise a plurality of buffers configured to buffer the ramp signal and the reference voltage signal, and the plurality of buffers each have the same noise characteristics.

In another aspect, there is provided a gain control device for controlling gains of a ramp signal and a reference voltage signal, the gain controller configured to attenuate a magnitude of the ramp signal by connecting a plurality of resistors between an output port of the ramp signal and an output port of the reference voltage signal in series, and varying an output route such that the ramp signal is output from one node of the resistors.

The ramp signal may have the same noise characteristics as noise characteristics of the reference voltage signal.

In another aspect, there is provided an analog-to-digital (A/D) converter including a ramp signal generator comprising an integrator configured to generate a ramp signal, and configured to generate a reference voltage signal including noise that has the same noise characteristics as noise characteristics that are input into the ramp signal, and a digital converter comprising a comparator configured to convert an input analog signal into a digital signal based on the reference voltage signal and the ramp signal.

The integrator may comprise a first component configured to generate the ramp signal by is processing a signal of a direct current source, and a second component configured to generate the reference voltage signal by processing a signal of a direct voltage source, wherein the first component has the same noise characteristics as noise characteristics of the second component.

The ramp signal generator may further comprise a gain controller configured to attenuate a magnitude of the generated ramp signal or the generated reference voltage signal using electrical resistance.

The gain controller may attenuate the magnitude of the ramp signal by connecting a plurality of resistors between an output port of the ramp signal and an output port of the reference voltage signal in series, and varying an output route such that the ramp signal is output from one node of the resistors.

The ramp signal generator may further comprise a plurality of buffers configured to buffer the ramp signal and the reference voltage signal, and the plurality of buffers have the same noise characteristics.

In another aspect, there is provided an image sensor having an analog-to-digital (A/D) converter installed therein, the A/D converter including a ramp signal generator comprising an integrator that is configured to generate a ramp signal, and that is configured to generate a reference voltage signal including noise that has the same noise characteristics as noise characteristics that are input into the ramp signal, and a digital converter comprising a comparator that is configured to convert an input analog signal into a digital signal based on the reference voltage signal and the ramp signal.

The ramp signal generator may comprise a first circuit component configured to generate the ramp signal and a second signal component configured to generate the reference voltage signal, and the first circuit component and the second circuit component may comprise the same noise characteristics.

The ramp signal generator may generate the ramp signal by processing a signal from a direct current source, and the ramp signal generator may generate the reference voltage signal by processing a signal from a direct voltage source.

The ramp signal generator may comprise a buffer that includes a first buffer component configured to buffer the ramp signal and a second buffer component configured to buffer the reference voltage signal, and the first buffer component and the second buffer component comprise the same noise characteristics.

The ramp signal generator may comprise an integrator configured to generate the ramp signal by calculating the integral of a signal that is output from a direct current source, and that is configured to generate the reference voltage signal by calculating the integral of a signal that is output from a direct voltage source.

Other features may be apparent from the following detailed description, the drawings, and the claims.

Figure 1:
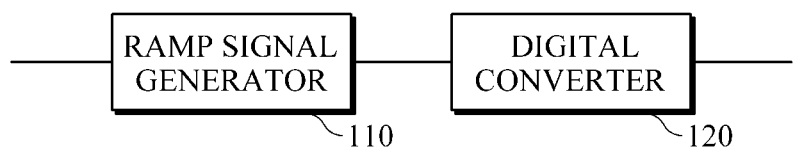
FIG. 1 is a diagram illustrating an example of an analog-to-digital converter that includes a ramp signal generator.

Throughout the drawings and the detailed description, unless otherwise described, the is same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 illustrates an example of an analog-to-digital (A/D) converter that includes a ramp signal generator.

Referring to FIG. 1, the analog-to-digital (A/D) converter includes a ramp signal generator 110 and a digital converter 120. The ramp signal generator 110 generates a ramp signal and a reference voltage signal. The reference voltage signal may include noise that has the same noise characteristics as noise characteristics that are input into the ramp signal. Further description of the ramp signal generator 110 is described with reference to FIG. 2, in which the ramp signal and the reference voltage signal are generated from an integrator that calculates the integral of signals of a direct current source and a direct voltage source.

The integrator may include a first component that is configured to generate the ramp signal by processing a signal of a direct current source. The integrator may include a second component that is configured to generate the reference voltage signal by processing a signal of a direct voltage source. For example, the first component may have the same noise characteristics as the noise characteristics of the second component. Each of the first is component and the second component may be implemented using an amplifier.

The digital converter 120 may include a comparator that is configured to convert an input analog signal into a digital signal using the reference voltage signal and the ramp signal that are generated in the ramp signal generator 110. Hereinafter, further description and a circuit layout of the ramp signal generator 110 are described with reference to FIGS. 2 to 4.

Figure 2:
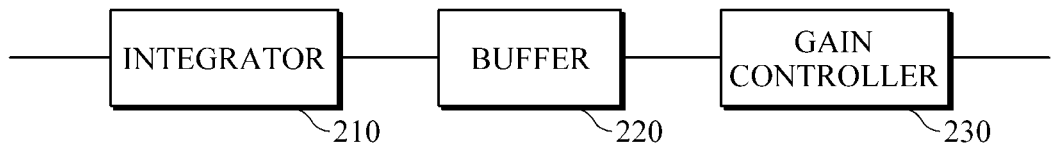
FIG. 2 is a diagram illustrating an example of a ramp signal generator.

FIG. 2 illustrates an example of a ramp signal generator.

Referring to FIG. 2, ramp signal generator 110 includes an integrator 210, a buffer 220, and a gain controller 230.

The integrator 210 may generate a ramp signal by processing a signal of a direct current source and may generate a reference voltage signal by processing a signal of a direct voltage source. The reference voltage signal may be generated using a circuit component that has the same noise characteristics as that of a circuit component that is used in generating the ramp signal. Accordingly, the reference voltage signal may include noise that has the same noise characteristics as noise characteristics that are input into the ramp signal. For example, each of the circuit components may be implemented using an amplifier circuit.

The buffer 220 may perform buffering on the ramp signal and reference voltage signal that are generated above. The ramp signal may be buffered using a circuit component that has the same noise characteristics as that of a circuit component that is used in buffering the reference voltage signal. For example, each of the circuit components for buffering may be implemented using an amplifier circuit.

The gain controller 230 may attenuate the magnitude of the buffered ramp signal or the buffered reference voltage signal using electrical resistance. For example, the gain controller 230 may attenuate the magnitude of the ramp signal by connecting a plurality of resistors between an output port of the ramp signal and an output port of the reference voltage signal, in series, and varying an output route such that the ramp signal is output from one of nodes among the resistors.

Figure 3:
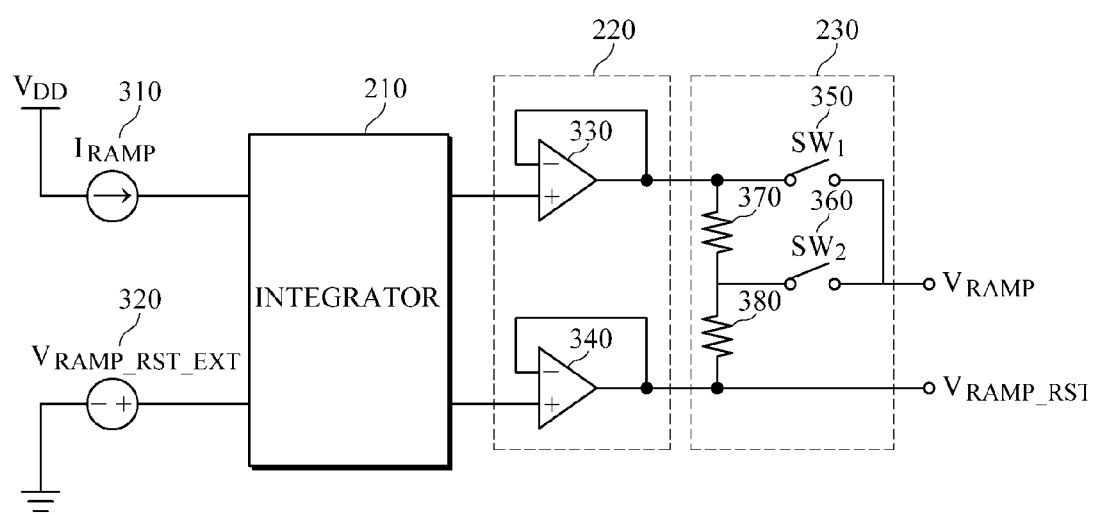
FIG. 3 is a circuit diagram illustrating an example of a ramp signal generator.

FIG. 3 illustrates an example of a circuit diagram of a ramp signal generator.

Referring to FIG. 3, the operation of the above described ramp signal generator is described. In this example, integrator 210 receives a signal $I_{RAMP}$ that is output from a direct current source 310 and a signal $V_{RAMP\_RST\_EXT}$ that is output from a direct voltage source 320. The integrator 210 may generate a ramp signal by calculating the integral of the signal $I_{RAMP}$ and may generate a reference voltage signal by calculating the integral of the signal $V_{RAMP\_RST\_EXT}$. In the generating of the reference voltage signal, the reference voltage signal may be amplified by an amplifier circuit that has the same structure as that of an amplifier circuit that is used to generate the ramp signal. Accordingly, the electric power noise and circuit noise that are input into the reference voltage signal are of the same degree as electric power noise and circuit noise that are input into the ramp signal.

The ramp signal and the reference voltage signal that each have noise input therein are input into the buffer 220 that includes amplifiers 330 and 340. As described herein, the amplifiers 330 and 340 are configured to have the same noise characteristics as each other. The amplified signals output from the amplifiers 330 and 340 are input to the gain controller 230 that includes switches including a first switch 350 and a second switch 360 and resistors including a first resistor 370 and a second resistor 380. For example, the first resistor 370 may have the same resistance value as that of the second resistor 380, or may have a different resistance value than that of the second resistor 380.

In the example in which the first resistor 370 has the same resistance value as that of the second resistor 380, if the first switch 350 is an ON state and the second switch 360 is OFF state, a ramp signal $V_{RAMP}$ that is output from the gain controller 230 may have the same magnitude as that obtained after the ramp signal passes through the buffer 220. If the first switch 350 is an OFF state and the second switch 360 is ON state, a ramp signal $V_{RAMP}$ that is output from the gain controller 230 may have half of the magnitude obtained after the ramp signal passes through the buffer 220, so that the ramp signal $V_{RAMP}$ has half of the slope of the ramp signal that passes through the buffer 220. If the first resistor 370 has a different resistance value from that of the second resistor 380, the slope of the ramp signal $V_{RAMP}$ output from the gain controller 230 may vary based on the ratio of resistance values between the first resistor 370 and the second resistor 380.

In this example, the gain controller 230 may control the slope of the ramp signal $V_{RAMP}$ using the resistance value. In FIG. 3, the slope of the ramp signal is controlled by use of two resistors, however, the number of resistors used in controlling the slope of the ramp signal is not limited thereto. According to another example, the gain controller 230 may include a plurality of resistors that have different resistor values from among one another to control the slope of the ramp signal.

Figure 4:
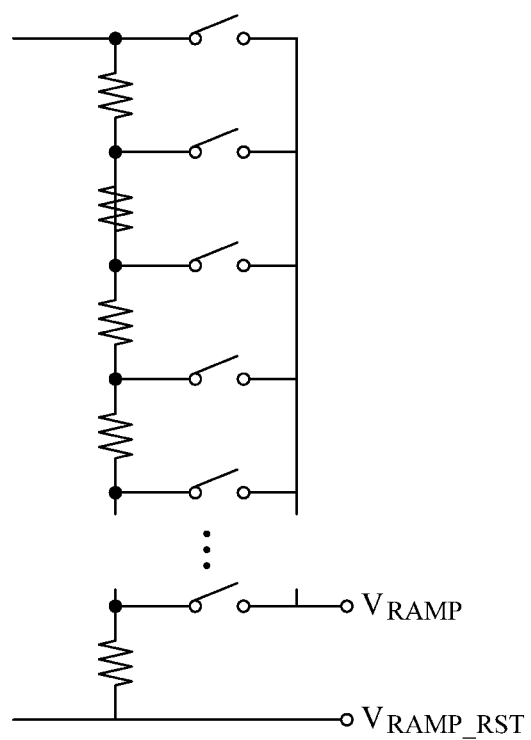
FIG. 4 is a circuit diagram illustrating an example of a gain controller.

FIG. 4 is a circuit diagram that illustrates an example of a gain controller.

Referring to FIG. 4, by using two or more resistors and two or more switches, the slope of the ramp signal $V_{RAMP}$ may be more finely controlled.

Figure 5:
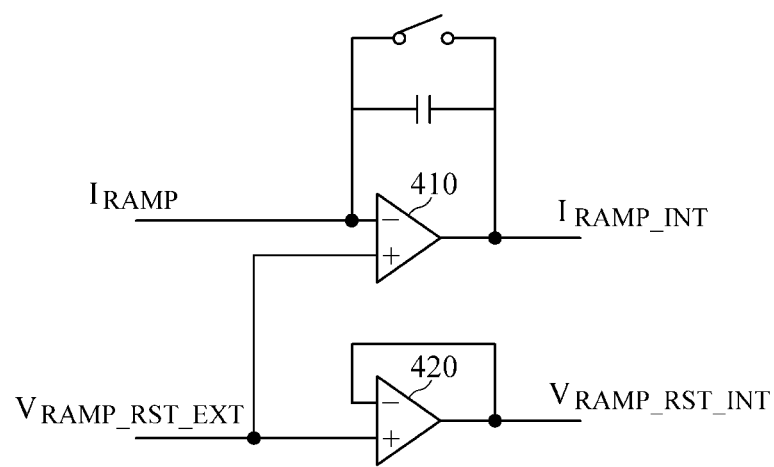
FIG. 5 is a circuit diagram illustrating an example of an integrator of FIG. 3.

FIG. 5 is a circuit diagram that illustrates an integrator of FIG. 3.

Referring to FIG. 5, the signal $V_{RAMP\_RST\_EXT}$ that is output from the direct voltage source 320 is input into an amplifier 410 that has the same structure as that of an amplifier 420 that is used to amplify the signal $I_{RAMP}$ of the direct current source 310. Accordingly, the output signals of the integrator may have the same noise characteristics as each other.

Figure 6:
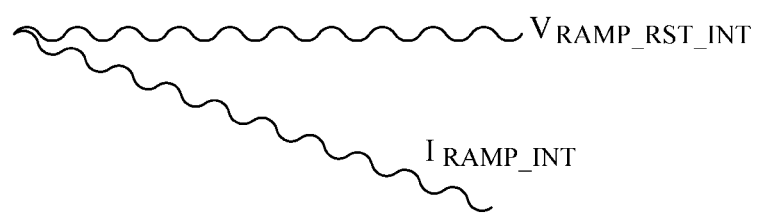
FIG. 6 is a diagram illustrating an example of output signals of the integrator of FIG. 6.

FIG. 6 illustrates an example of output signals of the integrator of FIG. 6.

Referring to FIG. 6, the signals $V_{RAMP\_RST\_INT}$ and $I_{RAMP\_INT}$ that each have the same electric power noise and circuit layout noise are inputted thereto and are output from the integrator.

For example, the A/D converter that has the above ramp signal generator may be installed on an image sensor. Accordingly, an example of the image sensor may have an A/D converter, including a ramp signal generator and a digital converter, installed therein. The ramp generator may include an integrator configured to generate a ramp signal and a reference voltage signal including noise that has the same noise characteristics as noise characteristics that are input into the ramp signal. The digital converter may include a comparator configured to convert an input analog signal into a digital signal using the reference voltage signal and the ramp signal.

Figure 7:
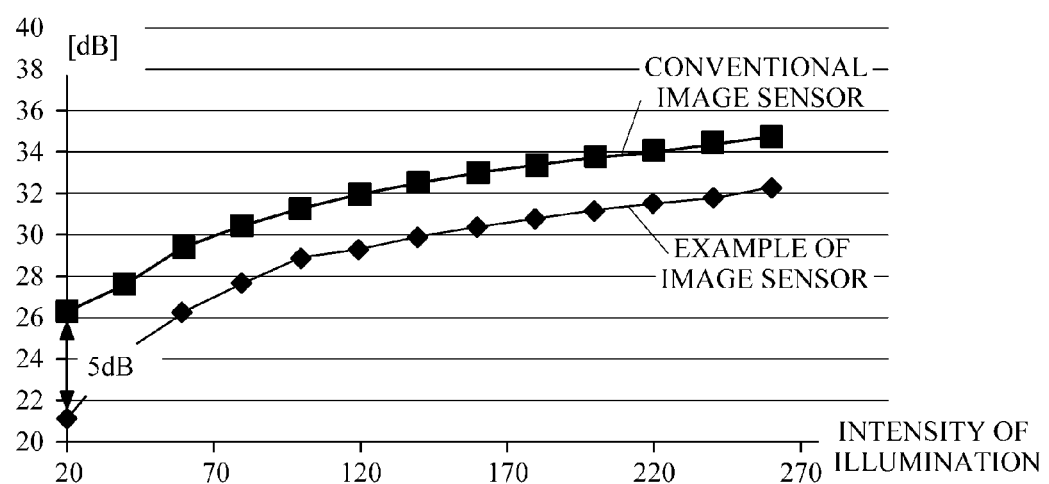
FIG. 7 is diagram illustrating an example of the improvement in the signal to noise ratio (SNR) of an image that is obtained by an image sensor.

FIG. 7 illustrates an example of the improvement in the signal to noise ratio (SNR) of an image that is obtained by an image sensor.

Referring to FIG. 7, the signal to noise ratio (SNR) is calculated according to 20*log (output value/random noise), and the random noise represents the standard deviation of 200 images that are obtained at the same intensity of illumination, with respect to time. As shown in the example of FIG. 7, an improvement in SNR of about 5% is achieved in both cases of the low intensity of illumination and the high intensity of illumination.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

As a non-exhaustive illustration only, a terminal/device/unit described herein may refer to mobile devices such as a cellular phone, a personal digital assistant (PDA), a digital camera, a portable game console, and an MP3 player, a portable/personal multimedia player (PMP), a handheld e-book, a portable lab-top PC, a global positioning system (GPS) navigation, and devices such as a desktop PC, a high definition television (HDTV), an optical disc player, a setup box, and the like capable of wireless communication or network communication consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer. It will be apparent to those of ordinary skill in the art that the computing system or is computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A ramp signal generator comprising:
   an integrator configured to generate a ramp signal, and configured to generate a reference voltage signal including noise that has the same noise characteristics as noise characteristics that are input into the ramp signal,
wherein the ramp signal generator is configured to adjust ramp signal based on the reference voltage signal.

2. The ramp signal generator of claim 1, wherein the integrator comprises:
a first component configured to generate the ramp signal by processing a signal of a direct current source; and
a second component configured to generate the reference voltage signal by processing a signal of a direct voltage source,
wherein the first component has the same noise characteristics as noise characteristics of the second component.

3. The ramp signal generator of claim 2, wherein the first component and the second component are each implemented using an amplifier.

4. The ramp signal generator of claim 1, further comprising a gain controller configured to attenuate a magnitude of the generated ramp signal or the generated reference voltage signal using electrical resistance.

5. The ramp signal generator of claim 4, wherein the gain controller attenuates the magnitude of the ramp signal by connecting a plurality of resistors between an output port of the ramp signal and an output port of the reference voltage signal in series, and varying an output route such that the ramp signal is output from one node of the resistors.

6. The ramp signal generator of claim 1, further comprising a plurality of buffers configured to buffer the ramp signal and the reference voltage signal, and the plurality of buffers each have the same noise characteristics.

7. A gain control device for controlling gains of a ramp signal and a reference voltage signal, the gain control device configured to attenuate a magnitude of the ramp signal by connecting a plurality of resistors between an output port of the ramp signal and an output port of the reference voltage signal in series, and varying an output route such that the ramp signal is output from one node of the resistors.

8. The gain control device of claim 7, wherein the ramp signal has the same noise characteristics as noise characteristics of the reference voltage signal.

9. An analog-to-digital (A/D) converter comprising:
a ramp signal generator comprising an integrator configured to generate a ramp signal, and configured to generate a reference voltage signal including noise that has the same noise characteristics as noise characteristics that are input into the ramp signal; and
a digital converter comprising a comparator configured to convert an input analog signal into a digital signal based on the reference voltage signal and the ramp signal.

10. The A/D converter of claim 9, wherein the integrator comprises:
a first component configured to generate the ramp signal by processing a signal of a direct current source; and
a second component configured to generate the reference voltage signal by processing a signal of a direct voltage source,
wherein the first component has the same noise characteristics as noise characteristics of the second component.

11. The A/D converter of claim 9, wherein the ramp signal generator further comprises a gain controller configured to attenuate a magnitude of the generated ramp signal or the generated reference voltage signal using electrical resistance.

12. The A/D converter of claim 11, wherein the gain controller attenuates the magnitude of the ramp signal by connecting a plurality of resistors between an output port of the ramp signal and an output port of the reference voltage signal in series, and varying an output route such that the ramp signal is output from one node of the resistors.

13. The A/D converter of claim 9, wherein the ramp signal generator further comprises a plurality of buffers configured to buffer the ramp signal and the reference voltage signal, and the plurality of buffers have the same noise characteristics.

14. An image sensor having an analog-to-digital (A/D) converter installed therein, the A/D converter comprising:
a ramp signal generator comprising an integrator that is configured to generate a ramp signal, and that is configured to generate a reference voltage signal including noise that has the same noise characteristics as noise characteristics that are input into the ramp signal; and
a digital converter comprising a comparator that is configured to convert an input analog signal into a digital signal based on the reference voltage signal and the ramp signal.

15. The image sensor of claim 14, wherein the ramp signal generator comprises a first circuit component configured to generate the ramp signal and a second signal component configured to generate the reference voltage signal, and the first circuit component and the second circuit component comprise the same noise characteristics.

16. The image sensor of claim 14, wherein the ramp signal generator generates the ramp signal by processing a signal from a direct current source, and the ramp signal generator generates the reference voltage signal by processing a signal from a direct voltage source.

17. The image sensor of claim 14, wherein the ramp signal generator comprises a buffer that includes a first buffer component configured to buffer the ramp signal and a second buffer component configured to buffer the reference voltage signal, and the first buffer component and the second buffer component comprise the same noise characteristics.

18. The image sensor of claim 14, wherein the ramp signal generator comprises an integrator configured to generate the ramp signal by calculating the integral of a signal that is output from a direct current source, and that is configured to generate the reference voltage signal by calculating the integral of a signal that is output from a direct voltage source.

19. The ramp signal generator of claim 1, wherein the integrator comprises an amplifier configured to receive the ramp signal and the reference voltage signal as inputs, configured to amplify the ramp signal based on the reference voltage signal, and configured to output the amplified ramp signal as an output.

* * * * *